US012112938B2

(12) United States Patent
Wei et al.

(10) Patent No.: US 12,112,938 B2
(45) Date of Patent: Oct. 8, 2024

(54) SEMICONDUCTOR PROCESSING PRECLEAN METHODS AND APPARATUS

(71) Applicant: ASM IP HOLDING B.V., Almere (NL)

(72) Inventors: Chuang Wei, Chandler, AZ (US); Aditya Chaudhury, Tempe, AZ (US); Prahlad Kulkarni, Tempe, AZ (US); Xing Lin, Chandler, AZ (US); Xiaoda Sun, Tempe, AZ (US); Woo Jung Shin, Chandler, AZ (US); Bubesh Babu Jotheeswaran, Gilbert, AZ (US); Fei Wang, Portland, OR (US); Qu Jin, Chandler, AZ (US); Aditya Walimbe, Tempe, AZ (US); Rajeev Reddy Kosireddy, Tempe, AZ (US); Yen Chun Fu, Tempe, AZ (US); Amin Azimi, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 156 days.

(21) Appl. No.: 17/655,245

(22) Filed: Mar. 17, 2022

(65) Prior Publication Data

US 2022/0301856 A1 Sep. 22, 2022

Related U.S. Application Data

(60) Provisional application No. 63/162,878, filed on Mar. 18, 2021.

(51) Int. Cl.
*B08B 5/00* (2006.01)
*H01L 21/02* (2006.01)
(Continued)

(52) U.S. Cl.
CPC .......... *H01L 21/02046* (2013.01); *B08B 5/00* (2013.01); *H01L 21/31116* (2013.01); *H01L 21/67069* (2013.01); *H01J 2237/335* (2013.01)

(58) Field of Classification Search
CPC ......... H01L 21/02046; H01L 21/31116; H01L 21/67069; H01L 21/67017;
(Continued)

(56) References Cited

U.S. PATENT DOCUMENTS 4,749,440 A 6/1988 Blackwood
4,997,490 A * 3/1991 Vetter ............... H01L 21/67057
134/95.1

(Continued)

*Primary Examiner* — Mikhail Kornakov
*Assistant Examiner* — Emily H Yasharpour
(74) *Attorney, Agent, or Firm* — Banner & Witcoff, Ltd.

(57) ABSTRACT

In some embodiments, a method for semiconductor processing preclean includes removing an oxide layer from a substrate using anhydrous hydrogen fluoride in combination with water vapor. A system for the preclean may be configured to separate the anhydrous hydrogen fluoride and the water vapor until they are delivered to a common volume near the substrate. Corrosion within components of the system may be limited by purification of anhydrous hydrogen fluoride, passivation of components, changing component materials, and heating components. Passivation may be achieved by filling a gas delivery component with anhydrous hydrogen fluoride and allowing the anhydrous hydrogen fluoride to remain in the gas delivery component to form a passivation layer. Consistent water vapor delivery may be achieved in part by heating components using heaters.

11 Claims, 6 Drawing Sheets

(51) Int. Cl.
*H01L 21/311* (2006.01)
*H01L 21/67* (2006.01)

(58) Field of Classification Search
CPC ......... H01L 21/02049; H01L 21/67028; H01L 21/02057; H01L 21/67103; H01L 21/67253; B08B 5/00; H01J 2237/335; H01J 37/32357; H01J 37/32449; C23C 16/0227
USPC .............................. 134/902, 105, 102.1, 58 R
See application file for complete search history.

(56) References Cited

U.S. PATENT DOCUMENTS

| | | | | |
|---|---|---|---|---|
| 5,928,426 | A * | 7/1999 | Aitchison | B01D 53/005 55/440 |
| 6,221,168 | B1 | 4/2001 | Carter | |
| 2002/0062845 | A1 * | 5/2002 | Kawai | H01L 21/67069 134/36 |
| 2005/0126030 | A1 * | 6/2005 | Ohmi | H01L 21/02052 34/325 |
| 2006/0112974 | A1 * | 6/2006 | Isago | G03F 7/422 134/102.1 |
| 2016/0307771 | A1 * | 10/2016 | Xu | H01L 21/31116 |
| 2018/0350619 | A1 * | 12/2018 | Chen | H01L 21/308 |
| 2019/0221458 | A1 * | 7/2019 | Lu | C23C 16/455 |
| 2019/0348261 | A1 | 11/2019 | Lin | |

\* cited by examiner

SEMICONDUCTOR PROCESSING PRECLEAN METHODS AND APPARATUS

CROSS-REFERENCE TO RELATED APPLICATIONS

This application claims the benefit of priority to U.S. Provisional Application No. 63/162,878, filed Mar. 18, 2021, titled "FILM DEPOSITION SYSTEMS AND METHODS," which is hereby incorporated by reference herein in its entirety.

BACKGROUND

Field

This disclosure relates to methods and apparatus for the fabrication of semiconductor devices, and more particularly, to methods and apparatuses for pre-cleaning substrates prior to the deposition of material layers onto substrate during the fabrication of semiconductor devices.

Description of the Related Art

The fabrication of semiconductor devices, such as integrated circuits and power electronics semiconductor devices, often involves the etching of features into a substrate and/or the formation of one or more material layers on a substrate surface. The formation of the material layers may be achieved by a variety of deposition techniques including, for example, sputtering, chemical vapor deposition, atomic layer deposition, and so forth.

Substrates often have an intervening material on top of them that may interfere with etching that substrate and/or with forming a desired material layer on the substrate. For example, a silicon substrate may have a native silicon oxide layer. The intervening material may impact electrical performance, result in increased defects, and so forth. Accordingly, there is a need for methods and apparatus that can remove intervening material such as native oxides from substrates and provide a clean surface for further processing.

SUMMARY

In some embodiments, a semiconductor processing system for precleaning a substrate comprises a reaction chamber and an anhydrous hydrogen fluoride delivery system. The anhydrous hydrogen fluoride delivery system comprises: an upstream portion configured to be in fluid communication with an anhydrous hydrogen fluoride source, the upstream portion comprising: a pressure gauge configured to be in fluid communication with the anhydrous hydrogen fluoride source; a purifier in fluid communication with the pressure gauge and configured to remove water from anhydrous hydrogen fluoride from the anhydrous hydrogen fluoride source; a first anhydrous hydrogen fluoride conduit for forming a first portion of a flow path between the anhydrous hydrogen fluoride source and the reaction chamber; and one or more upstream heater jackets thermally coupled to the pressure gauge, the purifier, and the first anhydrous hydrogen fluoride conduit. The anhydrous hydrogen fluoride source further comprises: a downstream portion in fluid communication with the upstream portion, the downstream portion comprising: a second anhydrous hydrogen fluoride conduit for forming a second portion of the flow path between the anhydrous hydrogen fluoride source and the reaction chamber; and one or more downstream heater jackets thermally coupled to the second anhydrous hydrogen fluoride conduit. The semiconductor processing system further comprises a water vapor delivery system comprising: a water vapor source in fluid communication with a carrier gas source and configured to supply water vapor; a water vapor supply conduit forming a portion of a flow path between the water vapor source and the reaction chamber; a carrier gas conduit configured to be in fluid communication with the carrier gas source and the water vapor source; one or more water vapor source heater jackets thermally coupled to the water vapor source; one or more water vapor supply heater jackets thermally coupled to the water vapor supply conduit; and a pressure flow controller configured to be in fluid communication with the carrier gas source and the water vapor source, the pressure flow controller configured to regulate a pressure of carrier gas from the carrier gas source flowing to the water vapor source. The semiconductor processing system also comprises a reducing conduit in fluid communication with the anhydrous hydrogen fluoride delivery system and the water vapor delivery system, wherein the reaction chamber is in fluid communication with the reducing conduit.

In some embodiments, the semiconductor processing system for precleaning a substrate further comprises a remote plasma unit disposed between, and in fluid communication with, the anhydrous hydrogen fluoride delivery system, the water vapor delivery system, and the reaction chamber.

In some embodiments, the semiconductor processing system for precleaning a substrate further comprises a showerhead disposed inside the reaction chamber and configured to distribute anhydrous hydrogen fluoride and water vapor inside the reaction chamber.

In some embodiments, the semiconductor processing system for precleaning a substrate further comprises a susceptor configured to support the substrate within the reaction chamber, wherein the susceptor comprises a susceptor heating element.

In some embodiments, the semiconductor processing system for precleaning a substrate further comprises a reducing conduit for regulating a flow rate of one or more fluids into the reaction chamber, wherein the reducing conduit is in fluid communication with the water vapor delivery system and the anhydrous hydrogen fluoride delivery system.

In some embodiments, the one or more upstream heater jackets and the one or more downstream heater jackets of the semiconductor processing system are form-fitted to the upstream portion and the downstream portion, respectively.

In some embodiments, the anhydrous hydrogen fluoride delivery system of the semiconductor processing system for precleaning a substrate further comprises a controller configured to control one or more temperatures of the one or more upstream heater jackets, one or more temperatures of the one or more downstream heater jackets, and a flow rate of anhydrous hydrogen fluoride into a reaction chamber.

In some embodiments, the controller is programmed to maintain the downstream portion at a higher temperature than the upstream portion.

In some embodiments, the anhydrous hydrogen fluoride delivery system of the semiconductor processing system for precleaning a substrate further comprises a vent portion comprising a vent conduit connected to the second anhydrous hydrogen fluoride conduit and a vent heater jacket thermally coupled to the vent conduit, wherein the controller is programmed to maintain the vent conduit at a temperature greater than the temperature of the downstream portion.

In some embodiments, the water vapor delivery system of the semiconductor processing system for precleaning a substrate further comprises a vent conduit connected to the water vapor supply conduit, one or more vent heater jackets thermally coupled to the vent conduit, and a controller configured to control one or more temperatures of the one or more water vapor source heater jackets and one or more temperatures of the one or more water vapor supply heater jackets, wherein the controller is further configured to control one or more temperatures of the one or more vent heater jackets.

In some embodiments, the water vapor delivery system of the semiconductor processing system for precleaning a substrate further comprises a bleed conduit in fluid communication with the carrier gas source and the water vapor source, the bleed conduit configured to reduce backstreaming of one or more of the water vapor or the carrier gas.

In some embodiments, the water vapor source of the semiconductor processing system for precleaning a substrate comprises a space for liquid water and an overlying ullage space for water vapor.

In some embodiments, the water vapor supply heater jacket of the semiconductor processing system for precleaning substrates is configured to heat the water vapor supply conduit to a temperature of at least 40 degrees Celsius greater than the temperature of the water vapor source.

In some embodiments, a method for precleaning a substrate comprises: placing the substrate in a reaction chamber of a semiconductor processing system. The semiconductor processing system comprises an anhydrous hydrogen fluoride delivery system comprising: an upstream portion in fluid communication with an anhydrous hydrogen fluoride source, the upstream portion comprising: a purifier configured to remove water from anhydrous hydrogen fluoride from the anhydrous hydrogen fluoride source; a first anhydrous hydrogen fluoride conduit for forming a first portion of a flow path between the anhydrous hydrogen fluoride source and the reaction chamber; and one or more upstream heater jackets thermally coupled to the first anhydrous hydrogen fluoride conduit; a flow controller; a downstream portion downstream of the flow controller, the downstream portion comprising: a second anhydrous hydrogen fluoride conduit for forming a second portion of the flow path between the anhydrous hydrogen fluoride source and the reaction chamber; and one or more downstream heater jackets thermally coupled to the second anhydrous hydrogen fluoride conduit. The semiconductor processing system further comprises a water vapor delivery system comprising: a water vapor source configured to supply water vapor; a water vapor supply conduit forming a portion of a flow path between the water vapor source and the reaction chamber; a carrier gas source; a carrier gas conduit forming a portion of a flow path between the carrier gas source and the water vapor source; one or more water vapor source heater jackets thermally coupled to the water vapor source; one or more water vapor supply heater jackets thermally coupled to the water vapor supply conduit; and a pressure flow controller in fluid communication with the carrier gas source and the water vapor source, the pressure flow controller configured to regulate a pressure of carrier gas from the carrier gas source flowing to the water vapor source, wherein the reaction chamber is in fluid communication with the anhydrous hydrogen fluoride delivery system and the water vapor delivery system. The method further comprises removing material from a surface of the substrate, wherein removing the material comprises: flowing anhydrous hydrogen fluoride into the reaction chamber; and flowing water vapor into the reaction chamber.

In some embodiments, the method for precleaning a substrate further comprises maintaining the downstream heater jackets at a temperature higher than a temperature of the upstream heater jackets.

In some embodiments, the method for precleaning a substrate further comprises flowing anhydrous hydrogen fluoride into the reaction chamber and flowing water vapor into the reaction chamber simultaneously.

In some embodiments, the method for precleaning a substrate further comprises flowing anhydrous hydrogen fluoride into the reaction chamber and flowing water vapor into the reaction chamber sequentially.

In some embodiments, flowing anhydrous hydrogen fluoride into the reaction chamber and flowing water vapor into the reaction chamber comprises flowing the anhydrous hydrogen fluoride and the water vapor into a transfer tube upstream of the reaction chamber.

In some embodiments, flowing anhydrous hydrogen fluoride into the reaction chamber and flowing water vapor into the reaction chamber comprises flowing the anhydrous hydrogen fluoride and the water vapor into a reducing conduit upstream of the reaction chamber.

In some embodiments, maintaining the downstream heater jackets at a temperature higher than a temperature of the upstream heater jackets comprises maintaining a temperature difference of 10° C. or more between the upstream and downstream heater jackets.

In some embodiments, a semiconductor processing anhydrous hydrogen fluoride delivery system for delivering anhydrous hydrogen fluoride from an anhydrous hydrogen fluoride source to a reaction chamber comprises: an upstream portion configured to be in fluid communication with the anhydrous hydrogen fluoride source, the upstream portion comprising: a pressure gauge in fluid communication with the anhydrous hydrogen fluoride source; a purifier configured to remove water from anhydrous hydrogen fluoride from the anhydrous hydrogen fluoride source and in fluid communication with the pressure gauge; a first anhydrous hydrogen fluoride conduit for forming a first portion of a flow path between the anhydrous hydrogen fluoride source and the reaction chamber; and one or more upstream heater jackets thermally coupled to the pressure gauge, the purifier, and the first anhydrous hydrogen fluoride conduit; a downstream portion in fluid communication with the upstream portion, the downstream portion comprising: a second anhydrous hydrogen fluoride conduit for forming a second portion of the flow path between the anhydrous hydrogen fluoride source and the reaction chamber; and one or more downstream heater jackets thermally coupled to the second anhydrous hydrogen fluoride conduit; a vent portion comprising: a vent conduit connected to the second anhydrous hydrogen fluoride conduit; and a vent heater jacket thermally coupled to the vent conduit; and a controller configured to control one or more temperatures of the one of more upstream heater jackets, one or more temperatures of the one or more downstream heater jackets, and a flow rate of anhydrous hydrogen fluoride into a reaction chamber.

In some embodiments, the upstream heater jacket and the downstream heater jacket are form-fitted to the upstream portion and the downstream portion, respectively.

In some embodiments, the controller is programmed to maintain the downstream portion at a higher temperature than the upstream portion.

In some embodiments, the controller is programmed to maintain the vent conduit at a temperature greater than the temperature of the downstream portion.

In some embodiments, a semiconductor processing water vapor delivery system for delivering water vapor from a water vapor source to a reaction chamber via a carrier gas supplied by a carrier gas source comprises: a water vapor source configured to be in fluid communication with the carrier gas source and configured to supply water vapor; a water vapor supply conduit forming a portion of a flow path between the water vapor source and the reaction chamber; a carrier gas conduit forming a portion of a flow path between the carrier gas source and the water vapor source; one or more water vapor source heater jackets thermally coupled to the water vapor source; one or more water vapor supply heater jackets thermally coupled to the water vapor supply; a pressure controller in fluid communication with the carrier gas source and the water vapor source, configured to regulate a pressure of the carrier gas; and a controller configured to control one or more temperatures of the one or more water vapor source heater jackets and one or more temperatures of the one or more water vapor supply heater jackets.

In some embodiments, the water vapor delivery system further comprises a vent conduit connected to the water vapor supply conduit and one or more vent heater jackets thermally coupled to the vent conduit, wherein the controller is further configured to control one or more temperatures of the one or more vent heater jackets.

In some embodiments, the water vapor delivery system further comprises a bleed conduit in fluid communication with the carrier gas source and the water vapor source, the bleed conduit configured to reduce backstreaming of one or more of the water vapor or the carrier gas.

In some embodiments, the water vapor source of the water vapor delivery system comprises a space for liquid water and an overlying ullage space for water vapor.

In some embodiments the water vapor supply heater jacket is configured to heat the water vapor supply conduit to a temperature at least 40 degrees Celsius greater than the temperature of the water vapor source.

In some embodiments, the water vapor delivery system forms a retrofit kit for a semiconductor processing system, and the retrofit kit further comprises an anhydrous hydrogen fluoride delivery system for delivering anhydrous hydrogen fluoride from an anhydrous hydrogen fluoride source to a reaction chamber. The anhydrous hydrogen fluoride delivery system comprises: an upstream portion configured to be in fluid communication with the anhydrous hydrogen fluoride source. The upstream portion comprises: a pressure gauge in fluid communication with the anhydrous hydrogen fluoride source; a purifier configured to remove water from anhydrous hydrogen fluoride from the anhydrous hydrogen fluoride source and in fluid communication with the pressure gauge; a first anhydrous hydrogen fluoride conduit for forming a first portion of a flow path between the anhydrous hydrogen fluoride source and the reaction chamber; and one or more upstream heater jackets thermally coupled to the pressure gauge, the purifier, and the first anhydrous hydrogen fluoride conduit. The anhydrous hydrogen fluoride delivery system further comprises a downstream portion in fluid communication with the upstream portion, the downstream portion comprising: a second anhydrous hydrogen fluoride conduit for forming a second portion of the flow path between the anhydrous hydrogen fluoride source and the reaction chamber; and one or more downstream heater jackets thermally coupled to the second anhydrous hydrogen fluoride conduit. The anhydrous hydrogen fluoride delivery system further comprises a vent portion comprising a vent conduit connected to the second anhydrous hydrogen fluoride conduit and a vent heater jacket thermally coupled to the vent conduit. The anhydrous hydrogen fluoride delivery system further comprises a controller configured to control one or more temperatures of the one of more upstream heater jackets, one or more temperatures of the one or more downstream heater jackets, and a flow rate of anhydrous hydrogen fluoride into a reaction chamber.

In some embodiments, a method for forming a passivating film on an interior surface of a gas delivery component comprises flushing the gas delivery component with an inert gas; filling the gas delivery component with anhydrous hydrogen fluoride by flowing anhydrous hydrogen fluoride into the gas delivery component; stopping the flow of anhydrous hydrogen fluoride into the gas delivery component; and maintaining the gas delivery component filled with anhydrous hydrogen fluoride.

In some embodiments, the passivating film may be a first passivating film and the method may further comprise generating a fluorine radical species using a remote plasma unit, communicating the fluorine radical species to a reducing conduit connected to the gas delivery component, and forming a second passivating film within the reducing conduit using the fluorine radical species.

In some embodiments, maintaining the gas delivery component filled with anhydrous hydrogen fluoride is performed for five to sixty minutes.

In some embodiments, flushing the gas delivery component is performed for five to sixty minutes.

In some embodiments, maintaining the gas delivery component filled with anhydrous hydrogen fluoride comprises maintaining the gas delivery component in fluid isolation.

In some embodiments, a method for forming a passivating film on an interior surface of a gas delivery component further comprises, after maintaining the gas delivery component filled with anhydrous hydrogen fluoride, evacuating the gas delivery component.

In some embodiments, the inert gas comprises nitrogen gas.

In some embodiments flushing the gas delivery component, filling the gas delivery component, stopping the flow of anhydrous hydrogen fluoride into the gas delivery component, and maintaining the gas delivery component filled with anhydrous hydrogen fluoride are repeated for a plurality of cycles.

In some embodiments, the plurality of cycles comprises 25 or more cycles.

In some embodiments, purging the gas delivery component removes substantially all condensed water from the interior surface of the gas delivery component.

In some embodiments, the gas delivery component comprises a component of an anhydrous hydrogen fluoride delivery system.

BRIEF DESCRIPTION OF THE DRAWINGS

Various features, aspects, and advantages of the disclosure are described with reference to drawings of certain embodiments, which are intended to illustrate, but not to limit, the present disclosure. It is to be understood that the accompanying drawings, which are incorporated in and constitute a part of this specification, are for the purpose of illustrating concepts disclosed herein and may not be to scale.

DETAILED DESCRIPTION OF EMBODIMENTS

Figure 1:
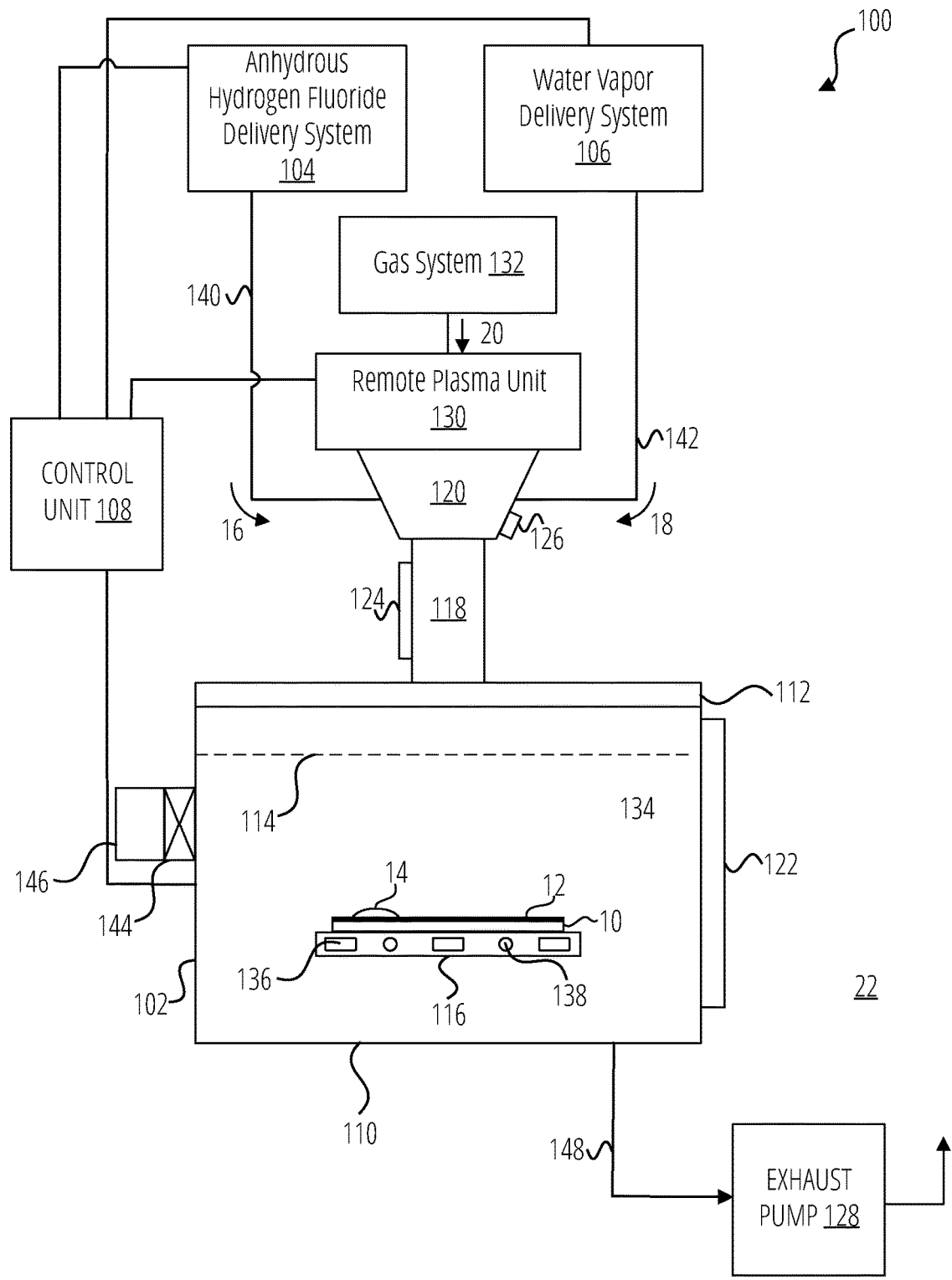
FIG. 1 schematically depicts a semiconductor processing system for preclean, according to some embodiments.

Certain embodiments of the disclosure will now be described. The terminology used in the description presented herein is not intended to be interpreted in any limited or restrictive manner, simply because it is being utilized in conjunction with a detailed description of embodiments of the disclosure. Furthermore, embodiments of the disclosure may include several novel features, no single one of which is solely responsible for its desirable attributes or essential to practicing the embodiments of the disclosure herein described. For purposes of this disclosure, certain aspects, advantages, and novel features of various embodiments are described herein. It is to be understood that not necessarily all such advantages may be achieved in accordance with any particular embodiment. Thus, for example, those skilled in the art will recognize that one embodiment may be carried out in a manner that achieves one advantage or group of advantages as taught herein without necessarily achieving other advantages as may be taught or suggested herein.

As discussed above and as will now be explained in more detail, this disclosure includes descriptions of systems and methods for precleaning substrates using anhydrous hydrogen fluoride (AHF) and water vapor while mitigating corrosion of system components, including components of AHF and water vapor delivery systems and the reaction chamber. The systems and methods described herein may be used during semiconductor processing, for example during the fabrication of semiconductor devices.

Substrates are commonly precleaned prior to further processing, such as the deposition of films onto the substrates or the etching of the substrates to form features therein, to ultimately form, for example, integrated circuits. In some cases, the preclean process removes native oxide, such as silicon oxide, from the surface of the substrate which may be, for example, semiconductor substrates that comprise a semiconductor material such as silicon. Examples of semiconductor substrates include silicon wafers, and silicon wafers having one or more material layers disposed thereon. In some cases, the material layers may include one or more patterned material layers. A fluorine-based chemistry in which etchant radicals react with an oxide surface may be used to remove the oxide layer from the substrate surface.

In some embodiments, it may be preferable to preclean substrates without the use of radical species. For example, a plasma etch process using radical species may result in etching of the underlying substrate surface. A substrate may be precleaned using AHF and water vapor, which may be delivered to the substrate utilizing a diluent carrier gas such as argon or nitrogen gas. During a precleaning process, the AHF may combine with the water vapor to generate hydrofluoric acid (HF), which may be used to remove silicon oxide from the surface of the substrate. Advantageously, such a precleaning process allows silicon oxide removal without the use of radical species. It will be appreciated, however, that the systems and methods disclosed herein also have advantages where radical fluorine-containing species are utilized and that such radical species may be utilized in some embodiments.

The AHF and water vapor may combine within a reaction chamber or, in some cases, prior to reaching the reaction chamber. Because HF is highly corrosive, it may be preferable that the AHF and water vapor be separated until both are at or near the substrate surface in a reaction chamber. Preferably, in some embodiments, the AHF and water vapor do not combine within any AHF or water vapor delivery component, and do not combine within the reaction chamber until they are near the surface of the substrate. Without being limited by theory, such an arrangement is believed to reduce corrosion and damage to the reaction chamber and to the components of the AHF and water vapor delivery systems.

In some embodiments, water vapor and AHF may be flowed sequentially. That is, the water vapor may first be flowed into the reaction chamber followed by a flow of AHF, or this order may be reversed. This process may be cycled to provide alternating flows of water vapor and AHF, respectively, throughout one or more steps in a precleaning process. For example, one cycle may include at least one exposure to each of water vapor and AHF, and the precleaning process may include multiple sequential cycles, one after the other.

Such alternating flows, however, may result in water vapor and AHF mixing within the transfer conduits of the AHF and water vapor delivery systems, since there is not a constant forward flow of water vapor and AHF through their respective systems. Thus, in some embodiments, to guard against such mixing, AHF and water vapor may be flowed into the reaction chamber simultaneously.

In some embodiments, the preclean process may be controlled at least in part by controlling the flow of water vapor into the reaction chamber, which may provide a mechanism to control the generation of HF at the substrate. Control of the water vapor flow may also be used to limit any flow of water vapor into other components of the system, for example by limiting the flow of water vapor to a quantity sufficient for performing a precleaning process, such that all or substantially all of the water vapor reacts with AHF. In some embodiments, the reaction chamber may be part of a larger cluster or system that includes, for example, a transfer chamber, one or more other reaction chambers (which may be used for the same or other processes), and so forth. Accordingly, it may be advantageous to reduce an amount of water vapor that can flow out of the reaction chamber and into other components of the larger cluster or system. In some embodiments, the preclean process may include a delay to allow unreacted water vapor to be removed from the reaction chamber prior to exposing the reaction chamber to other components, for example by opening a gate valve.

Because AHF provides a high reaction rate with respect to common materials used in preclean processing equipment such as stainless steel, there is a significant risk of damaging the reaction chamber and other components of the system and contaminating wafers. The presence of AHF may be especially problematic when surfaces have a chemical residue or moisture condensation. For example, contaminants on the surfaces of an equipment component may cause pitting of the surfaces when they are exposed to corrosive materials, especially at grain boundaries. In some cases, the pitting may cause particles to shed from components such as gas lines, regulators, and so forth, potentially leading to particles accumulating on and contaminating the substrate. This may significantly impact the usability of the substrate, in some cases rendering the substrate unusable.

Correcting problems related to corrosion may have a significant impact on end users of a preclean system. For example, contamination issues may require extended downtime to clean equipment, may require that parts be replaced, and in many scenarios, may trigger lengthy requalification processes before the equipment may be put back into regular use. If the system is deployed in a production facility, this may create a significant bottleneck that impacts not only downstream processes but also upstream processes, as some sequences of processing steps are time-sensitive (for example, if a substrate surface is unstable, it may not be possible to store the substrate until the manufacturing process may be resumed). Additionally, contaminated substrates may impact other equipment used at subsequent steps in a manufacturing process. For example, deposition equipment, wet etch equipment, dry etch equipment, lithography tools, and so forth may be impacted, especially in cases where no particle check is performed on the substrates immediately after the preclean process.

Thus, it may be advantageous to prevent corrosion of the AHF delivery components, the water vapor delivery components, and so forth. Corrosion may be mitigated with various design choices. For example, the AHF delivery system and other components may be heated to limit water condensation, component materials that are less prone to corrosion may be selected, reactive species (e.g., AHF and water vapor) may be kept separate except near the wafer surface, or a passivation layer may be formed on one or more components.

Various methods and apparatuses described herein are directed at least in part to facilitating substrate precleaning while mitigating reactions with a semiconductor processing system that can lead to corrosion and substrate contamination. For example, a semiconductor processing system may be configured with an anhydrous hydrogen fluoride source that is configured to prevent or reduce corrosion by reducing the moisture content of anhydrous hydrogen fluoride and/or by heating components of the system to prevent the condensation of water vapor on the internal surfaces of components such as valves, mass flow controllers, conduits, and so forth. In some embodiments, the moisture content of anhydrous hydrogen fluoride may be reduced by adding a purifier after an anhydrous hydrogen fluoride source. In some embodiments, heaters may be form-fitted to prevent the formation of cold spots where water vapor might condense. In some embodiments, temperature gradients may be used to cause water vapor to preferentially condense in certain parts of a flow path between an anhydrous hydrogen fluoride source and a reaction chamber. For example, it may be advantageous for condensation to occur upstream of a filter or purifier that can capture particulate matter.

The semiconductor processing system may further comprise a water vapor delivery system configured to facilitate a substrate preclean process. The excess flow of water vapor into a reaction chamber may cause undesirable condensation of water vapor within the reaction chamber and/or lead to the undesirable transport of water vapor into other components of the semiconductor processing system such as load locks, transfer chambers, purge stations, and so forth. The water vapor delivery system may advantageously deliver a controlled flow of water vapor to a reaction chamber, wherein the controlled flow is configured to deliver an amount of water vapor sufficient for carrying out a precleaning process. The water vapor may react with anhydrous hydrogen fluoride to form hydrogen fluoride, which may be used for precleaning substrates. The water vapor delivery system may comprise a heated container for water with an overlying ullage space above for containing water vapor, and nitrogen gas, argon gas, or another inert gas may flow through the container to pick up water vapor for delivery to the reaction chamber. Advantageously, the water vapor delivery system may have multiple heating zones to prevent condensation of water vapor within the system, which may prevent or reduce corrosion and may increase the stability of the water vapor delivery to the reaction chamber because less water vapor condenses onto the interior surfaces of components during transit to the reaction chamber, which may result in a more consistent flow of water vapor.

In some embodiments, one or both of the water vapor delivery system and the anhydrous hydrogen fluoride delivery system may form at least part of a retrofit kit that may be fitted to an existing semiconductor processing system to form a substrate precleaning system.

Corrosion may be further reduced or eliminated by forming passivating layers on components of the semiconductor processing system, which may be accomplished by, for example, exposing interior surfaces of components to controlled amounts of anhydrous hydrogen fluoride. In some embodiments, component materials may be changed to prevent or reduce corrosion. For example, Hastelloy may be used in place of stainless steel for some components.

The semiconductor processing system described above may be used to preclean substrates such as, for example, silicon wafers, prior to further processing, using anhydrous hydrogen fluoride which may react with water vapor to form hydrogen fluoride. The hydrogen fluoride may be used to, for example, remove a native oxide layer from a substrate. Advantageously, the semiconductor processing system may undergo suitably low degradation during precleaning, which may prolong the useful life of components of the processing system.

Reference will now be made to the drawings, in which like reference numerals refer to like parts throughout.

Semiconductor Processing System

FIG. 1 schematically depicts a semiconductor processing system 100 for precleaning substrates. The semiconductor processing system 100 is configured for precleaning substrates, e.g., a substrate 10, and in this respect includes a reaction chamber 102, an anhydrous hydrogen fluoride (AHF) delivery system 104, a water vapor delivery system 106, and a control unit 108. The reaction chamber 102 is configured to support the substrate 10 during removal of a material layer 12, e.g., a native oxide, from the substrate using an etchant 14. The AHF delivery system 104 is connected to the reaction chamber 102 and is configured to provide a flow of AHF 16 to the reaction chamber 102. The water vapor delivery system 106 is configured to provide a flow of water vapor 18 to the reaction chamber 102. In some embodiments, the semiconductor processing system 100 is configured to convey the AHF 16 and the water vapor 18 to the substrate 10 without reacting with one another, i.e., without generating hydrofluoric (HF) acid, until reaching the substrate 10, substantially all of the etchant 14 being generated in situ, i.e., at the substrate 10, by maintaining predetermined temperature gradients between elements of the AHF delivery system 104 and the reaction chamber 102, and the water vapor delivery system 106 and the reaction chamber 102. It will be appreciated that in situ generation of the etchant 14 limits (or eliminates) corrosion to components of the semiconductor processing system 100 that may otherwise be attendant with the etchant 14, for example, in the event that AHF encounters moisture within the semiconductor processing system 100 prior to arrival at the substrate 10. It will also be appreciated that the semiconductor processing system 100 may include other elements or exclude elements shown in the illustrated example while remaining within the scope of the present disclosure.

The reaction chamber 102 may include a chamber body 110, a lid 112, and a showerhead 114. The reaction chamber 102 may also include a susceptor 116 and may be connected by a transfer tube 118 to a reducing conduit 120. The reaction chamber 102 further includes a chamber heating element 122, a transfer tube heating element 124, and a reducing conduit heating element 126. The reaction chamber 102 may further include an exhaust pump 128, a remote plasma unit 130, and a gas system 132. The susceptor 116 may be disposed within an interior 134 of the chamber body 110, may be configured to support thereon the substrate 10, and may include a susceptor heating element 136 and a susceptor cooling circuit 138 for controlling a temperature of the substrate 10. The showerhead 114 may be seated within the interior 134 of the chamber body 110, separating the susceptor 116 from the lid 112, and fluidly coupling the susceptor 116 to the lid 112. The lid 112 may be connected to the chamber body 110, connects the transfer tube 118 to the chamber body 110, and fluidly couples the transfer tube 118 to the interior 134 of the chamber body 110, such as through an inlet port. The reducing conduit 120 may be connected to the transfer tube 118, coupled therethrough to the interior 134 of the chamber body 110, and configured for intermixing gases received therein prior to communication of the gases to the interior 134 of the chamber body 110 through the transfer tube 118. In this respect, the AHF delivery system 104 is connected to the reducing conduit 120 through an AHF delivery conduit 140 to provide the AHF 16 to the chamber body 110 through the reducing conduit 120 and the transfer tube 118, and the water vapor delivery system 106 is connected to the reducing conduit 120 through a water vapor delivery conduit 142 to provide the water vapor 18 to the chamber body 110 through the reducing conduit 120 and the transfer tube 118. A gate valve 144 may be connected to the chamber body 110 such that a substrate transfer robot 146 may transfer substrates, e.g., the substrate 10, into and out to the interior 134 of the chamber body 110 through the gate valve 144, such as for deposition of a material layer onto the substrate subsequent to removal of at least a portion of the material layer 12 using the etchant 14.

The exhaust pump 128 may be connected to the chamber body 110 by an exhaust conduit 148 for communicating a flow of reaction products 20 to the external environment 22. In certain embodiments, the AHF delivery system 104 may be connected to the exhaust pump 128, such as by an AHF delivery system vent conduit 230 (shown in FIG. 2). In such embodiments the AHF delivery system vent conduit 230 may bypass the chamber body 110, allowing for venting of the AHF 16 during processing for flow control purposes and/or to simplify the arrangement of the semiconductor processing system 100. In accordance with certain embodiments, the water vapor delivery system 106 may be connected to the exhaust pump 128, such as by a water vapor delivery system vent conduit 342 (shown in FIG. 3). In such embodiments the water vapor delivery system vent conduit 342 may bypass the chamber body 110, allowing for venting of the water vapor 18 during processing for flow control purposes and/or to simplify the arrangement of the semiconductor processing system 100.

The remote plasma unit 130 may be connected to the reducing conduit 120, fluidly coupled therethrough to the chamber body 110, and configured to provide radical species, e.g., fluorine radical species, to the chamber body 110 through the reducing conduit 120 and the transfer tube 118. The gas system 132 may be connected to the remote plasma unit 130 and therethrough with the chamber body 110, and may include a fluorine source to provide fluorine 20 to the remote plasma unit 130. In certain embodiments, the remote plasma unit 130 and the gas system 132 may cooperate to provide a flow fluorine of radicals to the chamber body 110, such as for passivating interior surfaces within the reducing conduit 120, the transfer tube 118, and the chamber body 110. It will be appreciated that passivating interior surfaces within the reducing conduit 120, the transfer tube 118, and the chamber body 110 may limit (or eliminate) corrosion within the semiconductor processing system 100 during generation of the etchant 14 when operating without radical species, e.g., without the employment of the remote plasma unit 130. In accordance with certain embodiments, the remote plasma unit 130 may be removed from the semiconductor processing system 100 subsequent to passivation of interior surfaces within one or more of the reducing conduit 120, transfer tube 118, and/or the chamber body 110. It is also contemplated that, in accordance with certain embodiments, the semiconductor processing system 100 may not include the remote plasma unit 130 and the gas system 132, simplifying the arrangement of the semiconductor processing system 100. In such embodiments, passivation of interior surfaces within one or more of the reducing conduit 120, the transfer tube 118, and/or the chamber body 110 may alternatively be accomplished ex situ.

The chamber heating element 122 may be thermally coupled to the chamber body 110 (e.g., may be in intimate mechanical contact with the chamber body 110), operably associated with the control unit 108, and configured for heating the chamber body 110. The transfer tube 118 may be thermally coupled to the transfer tube 118 (e.g., may be in intimate mechanical contact with the transfer tube 118), operably associated with the control unit 108, and configured for heating the transfer tube 118. The reducing conduit heating element 126 may be thermally coupled to the reducing conduit 120 (e.g., may be in intimate mechanical contract with the reducing conduit 120), is operably associated with the control unit 108, and is configured to heat the reducing conduit 120. The control unit 108 may be further operably connected to the susceptor heating element 136 and the susceptor cooling circuit 138 and configured to heat the susceptor 116 (and the substrate 10 supported thereon).

In some embodiments, the AHF delivery conduit 140 and the water vapor delivery conduit 142 are each separately connected to and output directly into the reaction chamber 102. In some embodiments, the AHF delivery conduit 140 and the water vapor delivery conduit 142 each directly connect to and output directly into the showerhead 114.

It will be appreciated that the AHF delivery conduit 140, the reducing conduit 120, the transfer tube 118, and the reaction chamber 102 may each be understood to be progressively further downstream of the AHF delivery system 104. Similarly, the water vapor delivery conduit 142, the reducing conduit 120, the transfer tube 118, and the reaction chamber 102 may each be understood to be progressively further downstream of the water vapor delivery system 106.

Components of the reaction chamber may be selected from materials that are resistant to corrosion in the presence of HF. For example, the showerhead 114 may be made from passivated nickel. The susceptor 116 may be made from bulk aluminum, such as AL6061-T6, and may include a nickel coating, such as an electroless nickel plate coating. A wafer tray and lift pins may be made of high purity silicon carbide, preferably with no free silicon. Other chamber components may have an enhanced electroplated nickel coating on one or more surfaces. Nickel surfaces, such as the showerhead 114 and other chamber components, may have a nickel fluoride layer formed on them that acts as a protective layer. Other components may have other fluoride layers formed upon them, such as CrFx, FeFx, YOFx, AlFx and YFx, which may act to protect the surfaces of the components from corrosion.

With continued reference to FIG. 1, the control unit 108 may be configured to control operation of the system to effectuate the actions described herein. In some embodiments, the control unit 108 may be in electrical communication with and configured to control one or more of the reaction chamber 102, the AHF delivery system 104, the remote plasma unit 130, and the water vapor delivery system 106, and the various constituent components thereof. For example, the control unit 108 may communicate with the remote plasma unit 130 to control an operating power of the remote plasma unit 130, with the AHF delivery system 104 and/or the water vapor delivery system 106 to control a flow of reactant gas from the gas system 132 to the reaction chamber 102, and/or with the reaction chamber 102 to control one or more process conditions within the reaction chamber 102. The control unit 108 may include one or more processors, memory devices, and other electronic components that effectuate control of the operation of various components of the semiconductor processing system. As used herein, the term "control unit" includes any combination of individual controller devices and processing electronics that may be integrated with or connected to other devices (such as valves, sensors, etc.). Thus, in some embodiments, the control unit 108 may include a centralized controller that controls the operation of multiple (or all) system components. In some embodiments, the control unit 108 may be understood to include a plurality of distributed controllers that control the operation of one or more system components. Control sequences may be hardwired or programmed into the control unit 108. The memory devices of the control unit 108 may include non-transitory computer-readable medium, such as physical computer storage including hard drives, solid state memory, random access memory (RAM), read only memory (ROM), optical disc, volatile or non-volatile storage, combinations of the same and/or the like. The non-transitory computer-readable medium provides instructions to the one or more processors. It will be appreciated that the instructions may be for any of the actions described herein, such that processing of the instructions by the one or more processors causes the semiconductor processing system to perform those actions.

Anhydrous Hydrogen Fluoride Delivery System

An AHF source is preferably free of moisture (liquid water). However, current production processes may include undesirably high levels of moisture in the anhydrous hydrogen fluoride from the AHF source. For example, even commercially available high purity AHF may contain 3000 parts per billion or more of moisture. Should this moisture condense onto surfaces within an AHF delivery system, it may lead to corrosion and shedding of particles, which may result in substrate contamination. A purifier may be used to remove moisture that is present in the AHF source. Preferably, the purifier is placed close to the AHF source in order to limit the surface area of the processing system (e.g., the inner walls of a conduit, valve, flow controller, and so forth) that is potentially exposed to both AHF and entrained water within the AHF.

Figure 2:
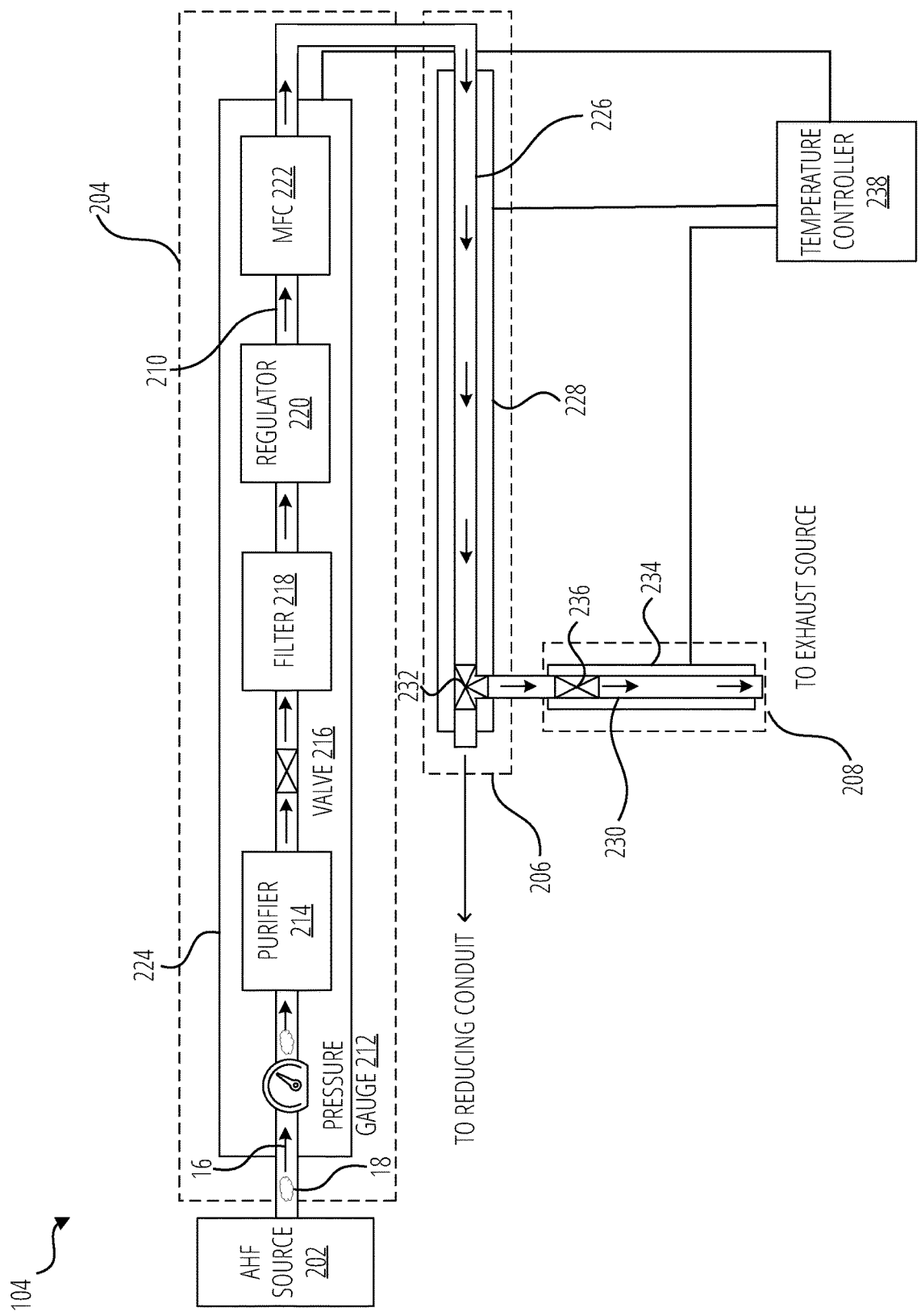
FIG. 2 schematically depicts an anhydrous hydrogen fluoride delivery system according to some embodiments.

Turning to FIG. 2, the AHF delivery system 104 according to some embodiments is schematically depicted. The AHF delivery system 104 may include an anhydrous hydrogen fluoride (AHF) source 202, an upstream portion 204, a downstream portion 206, and a vent portion 208. The AHF delivery system 104 may be fluidly connected to a reaction chamber, such as the reaction chamber 102 (shown in FIG. 1). During operation, AHF 16 and water vapor 18 that was present in the AHF source 202 flows from the AHF source 202 and into the upstream portion 204. The upstream portion 204 may include a first AHF conduit 210 for transporting the AHF 16, a pressure gauge 212, a purifier 214, a valve 216, a filter 218, a regulator 220, and a mass flow controller (MFC) 222. The first AHF conduit 210, and the components 212 through 222 may be enclosed in and thermally coupled to an upstream heater jacket 224, which may continuously extend across the first AHF conduit 210, and the components 212 through 222, or may be discontinuous.

In some embodiments, the purifier 214 may be capable of reducing the moisture (e.g., water) content of the AHF source 202 by about an order of magnitude or more. In some embodiments, the purifier 214 may be positioned differently, but advantageously the purifier 214 is placed near the AHF source 202, and upstream of other components to reduce the possibility of damage to those components from water condensation and the formation of hydrogen fluoride. In some embodiments, the purifier 214 may include a Gate-Keeper® GPU FX purifier, available from Entegris Inc., of Billerica, MA In some embodiments the valve 216 may be a manual valve, pneumatic valve, or other suitable valve for controlling the flow of AHF. In some embodiments, more than one valve may be used such as, for example, both a manual valve and a pneumatic valve.

The upstream heater jacket 224 may be used to heat the first AHF conduit 210 and upstream components such as components 212 through 222. In some embodiments, the upstream heater jacket 224 may operate in a range of from about 40 degrees Celsius to about 70 degrees Celsius, 80 degrees Celsius, or even more if desired. It may be advantageous to reduce condensation by setting the upstream heater jacket 224 to a high temperature. For example, it may be preferable to heat components above the boiling point of water. However, the temperature of the upstream heater jacket 224 may be restricted by the thermal limitations of one or more components. For example, the MFC 222 may have electronic circuitry that has a particular temperature range for operation, or gaskets and other components may be damaged or may undesirably be reduced in operational life due to, for example, thermal expansion, when heated over a certain temperature. Advantageously, in some embodiments, condensation may be limited by heating below the boiling point of water. For example, heating to from about 40 degrees Celsius to about 60 degrees Celsius may protect active components while still usefully limiting condensation.

The downstream portion 206 comprises a second anhydrous hydrogen fluoride conduit 226. The second AHF conduit 226 is preferably enclosed in and thermally coupled to a downstream heater jacket 228. The second AHF conduit 226 may fluidly connect the upstream portion 204 (by connecting to the mass flow controller 222) with a reaction chamber, such as the reaction chamber 102 (shown in FIG. 1). In some embodiments, the second AHF conduit 226 may not be continuous. For example, there may be one or more valves or other components between the MFC 222 and the reaction chamber 102. The downstream heater jacket 228 may heat the second AHF conduit 226 (as well as any other components between the MFC 222 and the reaction chamber 102) to a temperature of from about 50 degrees Celsius to about 70 degrees Celsius, about 80 degrees Celsius, or about 100 degrees Celsius. In some embodiments, the downstream heater jacket 228 may not enclose any active components (such as a mass flow controller). In some embodiments, the downstream heater jacket 228 may be configured to heat to a higher temperature than the upstream heater jacket 224. For example, the downstream heater jacket 228 may be configured to heat to about 10 degrees Celsius or more, about 20 degrees Celsius or more, or about 30 degrees Celsius or more than the temperature of the upstream heater jacket 224, while maintaining thermal compatibility with the materials and components of the downstream portion 206.

After the mass flow controller 222 and before a reaction chamber, a vent conduit 230 may branch off of the second anhydrous hydrogen fluoride conduit 226, such as at an AHF diverter valve 232. The vent conduit 230 may be enclosed within a vent heater jacket 234 which may be enclosed in and thermally coupled to the vent conduit 230 and may have a vent valve 236 arranged therealong. The vent heater jacket 234 may heat the vent conduit 230 to a temperature of about 70 degrees Celsius or more, about 80 degrees Celsius or more, about 100 degrees Celsius, or about 120 degrees Celsius or more. In some embodiments, the vent heater jacket 234 may be set to a higher temperature than both the downstream heater jacket 228 and the upstream heater jacket 224. For example, the vent heater jacket 234 may be configured to heat to about 10 degrees Celsius or more, about 20 degrees Celsius or more, or about 30 degrees Celsius or more than the temperature of the downstream heater jacket 228, while maintaining thermal compatibility with the materials and components of the vent conduit. Advantageously, in some embodiments, heating the vent conduit 230 allows the AHF delivery system 104 and the reaction chamber 102 to communicate with a common exhaust source, such as the exhaust pump 128 (shown in FIG. 1), thereby simplifying the arrangement of the semiconductor processing system 100.

The upstream heater jacket 224, the downstream heater jacket 228, and the vent heater jacket 234 may be controlled by a temperature controller 238. The temperature controller 238 may be configured to allow the temperature of each heater jacket in the AHF delivery system 104 to be independently controlled. Alternatively, the heater jackets may be controlled as a set. For example, the heater jackets may all be set to the same temperature, or temperature offsets between the heaters may be defined. Moreover, the heater jackets may be set to a temperature differing from that of the reducing conduit heating element 126 (shown in FIG. 1) such that a temperature gradient may exist between the AHF delivery system 104 and the reducing conduit 120. In certain embodiments, the AHF delivery system 104 may be cooler than the reducing conduit 120, such as in examples where the AHF delivery system 104 includes heat-sensitive elements. In accordance with certain embodiments, the temperature controller 238 may be part of the control unit 108 (shown in FIG. 1).

It will be appreciated that the AHF delivery system 104 may have more or fewer components from that described above, such as additional filtering, flow regulation, and the like. The AHF delivery system 104 may have more than three distinct heating zones or fewer than three distinct heating zones. For example, in some embodiments, the upstream portion 204, the downstream portion 206, and the vent portion 208 may be part of a single heating zone. In some embodiments there may be multiple heating zones within the upstream portion 204, the downstream portion 206, and/or the vent portion 208. For example, the upstream components within the upstream portion 204 may not all be at the same temperature. For example, passive components may be heated to a different temperature than active components. As just one example, the mass flow controller 222, which has active components that may be sensitive to heat, could have its own heater, which may be set to a lower temperature than the temperature to which passive components are heated.

Localized cold spots within the AHF delivery system 104 may undesirably provide areas for condensation, which may lead to corrosion and particle shedding. Thus, in some embodiments, the upstream heater jacket 224, the downstream heater jacket 228, the vent heater jacket 234, and any other heaters used in the AHF delivery system 104 may advantageously be form-fitted to the components to provide more uniform heating.

Some components of the AHF delivery system 104, such as the valve 216, the filter 218, the regulator 220, the MFC 222, and AHF diverter valve 232 may be mounted using C-seals on a C-seal block. Optionally, additional components may be mounted such as, for example, a pressure switch. Components of the AHF delivery system 104 may additionally or alternatively connect to one another using VCR fittings and gaskets at the points of connection.

While the purifier 214, the upstream heater jacket 224, the downstream heater jacket 228, and the vent heater jacket 234 may cooperate to remove water from the AHF delivery system 104 and thereafter limit (or prevent) the condensation of any residual entrained water vapor that may accompany the AHF 16 within the AHF delivery system 104, there remains the possibility that some entrained water vapor may condense inside the AHF delivery system 104. Thus, it may be preferable to change one or more materials used within the AHF delivery system 104 to reduce the likelihood of corrosion. For example, corrosion resistant grades of stainless steel such as Hastelloy may be employed. For example, the MFC 222 may include a Hastelloy stream. Table 1 lists example materials that may be used in the AHF delivery system 104 to reduce the corrosion of various components that may be present in the AHF delivery system 104. In some embodiments, the AHF delivery system 104 may include one or more components formed at least in part from one or more of the example materials. Some components may be formed by any one of multiple materials as listed below.

TABLE 1

| Component | Material(s) |
|---|---|
| C-seal Block | Hastelloy C22 |
| | Stainless Steel 316L |
| C-seal | Hastelloy C22 |
| | Nickel |
| | Stainless Steel 316L |
| Pneumatic Valve | Hastelloy C22 |
| | PCTFE |
| | Elgiloy |
| Filter | Hastelloy C22 |
| | PTFE |
| Pressure Regulator | Hastelloy C22 |
| | Elgiloy |
| Pressure Switch | Stainless Steel 316L |
| Mass Flow Controller | Hastelloy C22 |
| | Hastelloy C276 |
| | Ni—Co |
| | 316SS |
| VCR Gasket | Ni |
| | Hastelloy C22 |
| Gasline/Conduit | Hastelloy C22 |

Water Vapor Delivery System

A high degree of control over water vapor delivery to the reaction chamber 102 (shown in FIG. 1) is desirable to provide consistent substrate precleaning and to reduce corrosion of the reaction chamber 102 and other components such as the reducing conduit 120 (shown in FIG. 1) and the transfer tube 118 (shown in FIG. 1), as well as to prevent the contamination of transfer chambers, process chambers, and so forth with water vapor. In some embodiments, a bubbler-based system may be used to deliver a consistent low flow of water vapor to a reaction chamber.

Figure 3:
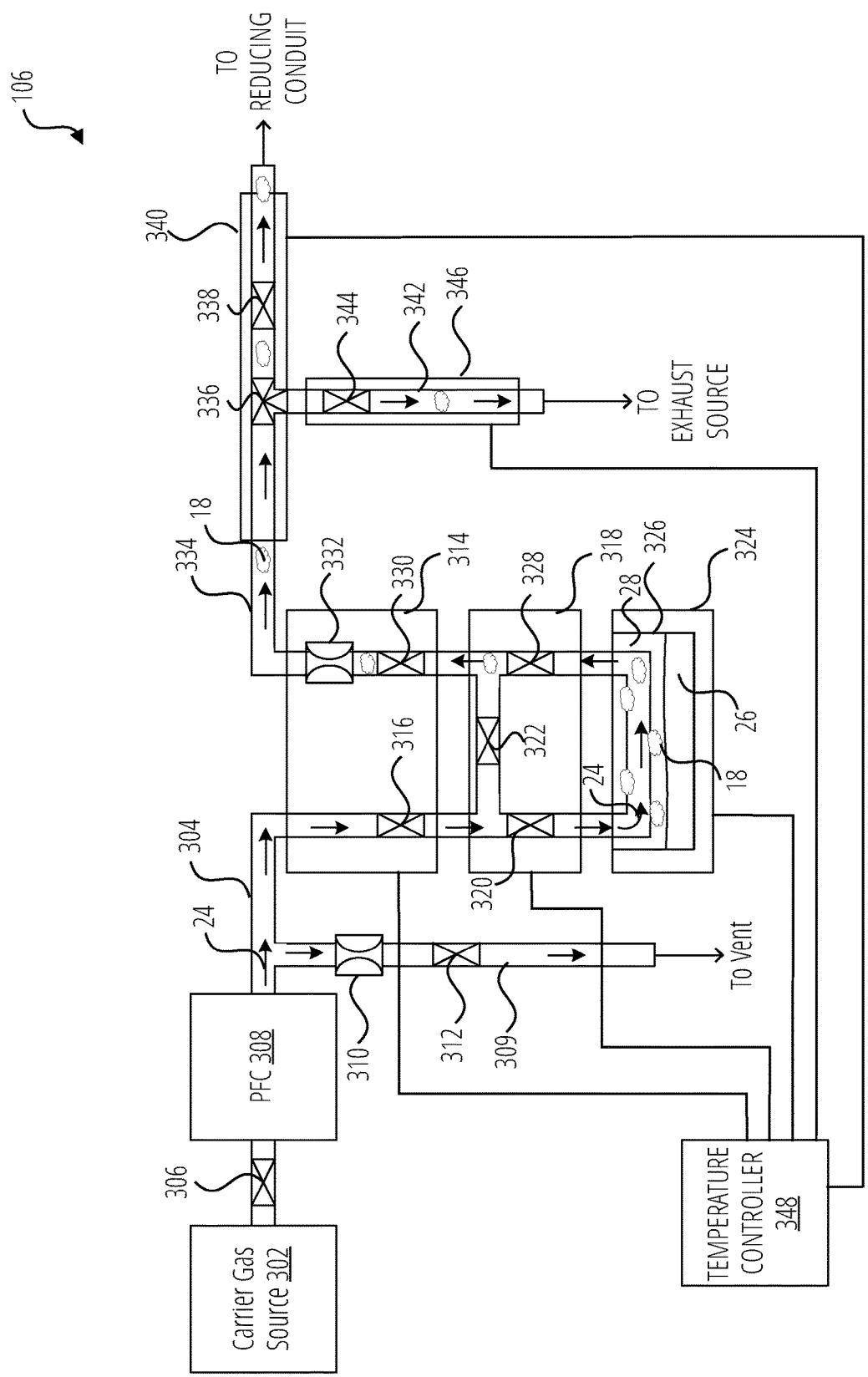
FIG. 3 schematically depicts a water vapor delivery system according to some embodiments.

Turning to FIG. 3, the water vapor delivery system 106 according to some embodiments is schematically illustrated. A carrier gas source 302 may be used to provide a carrier gas 24 such as, for example, nitrogen or argon gas, for the delivery of water vapor to a reaction chamber. The carrier gas source 302 may be in fluid communication with a water vapor source 326 by way of a carrier gas conduit 304. It will be appreciated that the water vapor source 326 provides water that may be transported to the reaction chamber 102 (shown in FIG. 1) in the form of water vapor. A pressure flow controller (PFC) 308 may be used to regulate the flow of the carrier gas. A valve 306 may be used to allow or deny flow from the carrier gas source 302 to the PFC 308. After the PFC 308, the carrier gas may flow into a bleed conduit 309 to vent in order to reduce or prevent backstreaming of the carrier gas 24 and/or the water vapor 18. The bleed conduit 309 may be discontinuous and may have a flow restrictor 310 and a valve 312 disposed along the bleed conduit 309 to regulate flow through the bleed conduit 309.

The water vapor delivery system 106 may have a plurality of heater jackets thermally coupled to components of the water vapor delivery system 106. The carrier gas 24 may flow through a first heating region with a first water vapor source heater jacket 314 enclosing a valve 316. The carrier gas 24 may then flow through a second heating region with a second water vapor source heater jacket 318 enclosing a valve 320 and a valve 322. The carrier gas may flow through the valve 320 into a third heating region with a third water vapor source heater jacket 324 enclosing a water vapor source 326 partially filled with liquid water 26 and having an overlying ullage space 28 above the liquid water 26 for containing water vapor. Alternatively, the valve 320 may be closed and the carrier gas 24 may instead flow through valve 322, bypassing the water vapor source 326, such as for purging or drying components downstream of the valve 322. If the carrier gas 24 flows into the water vapor source 326, the carrier gas 24 may pick up (entrain) the water vapor 18 and both may then flow through valve 328 enclosed by the second water vapor source heater jacket 318. The carrier gas 24 (and any water vapor 18 picked up if the carrier gas 24 flowed through water vapor source 326) may then flow through valve 330 enclosed by the first water vapor source heater jacket 314. In some embodiments, the water vapor flow 18 may be too low for a mass flow controller to reliably regulate the flow of water vapor 18 into the reaction chamber 102 (shown in FIG. 1). A flow restrictor 332 may be advantageous because it is a passive, physical part that may be sized for the maximum flow that could be desired for a process. The flow restrictor 332 may be used to deliver a consistent, controlled flow of the water vapor 18 to the reaction chamber 102. However, if the process carried out in the reaction chamber 102 is changed, the flow restrictor 332 may be replaced to provide the desired water vapor flow for the new process. For example, the flow restrictor 332 may be replaced if a change in the process requires a water vapor flow that is greater than the maximum flow of the flow restrictor 332.

The carrier gas 24 (and the water vapor 18 if the carrier gas 24 is flowed through the water vapor source 326) then flows through a water vapor supply conduit 334 (which may be connected to, for example, the water vapor delivery conduit 142 (shown in FIG. 1)) having a valve 336 configured to allow flow of the water vapor 18 to be directed toward the reaction chamber 102 (shown in FIG. 1) or to a vent conduit 342. The vent conduit 342 may be fitted with a valve 344 to permit or deny flow through the vent conduit 342, and the vent conduit 342 and the valve 344 may be enclosed in and thermally coupled to a vent conduit heater jacket 346. The vent conduit heater jacket 346 may heat the vent conduit 342 (and other components such as the valve 344) to a temperature of about 40 degrees Celsius, about 60 degrees Celsius, about 80 degrees Celsius, about 100 degrees Celsius, or any temperature in between these values, or even more if needed or desired. Advantageously, heating the vent conduit 342 may reduce (or eliminate) corrosion in embodiments where the water vapor delivery system 106 and the reaction chamber 102 communicate with a common exhaust source (such as the exhaust pump 128 shown in FIG. 1) in the event of backstreaming into the reaction chamber 102, thereby simplifying the semiconductor processing system 100 (shown in FIG. 1).

If the flow is not directly to the vent conduit by way of valve 336, then the carrier gas 24 (and the entrained water vapor 18 if present) may flow through a valve 338 and ultimately to the reaction chamber 102 (shown in FIG. 1). The valve 336, the valve 338, and the water vapor supply conduit 334 may be wrapped in a water vapor supply heater jacket 340. The water vapor supply heater jacket 340 may heat the water vapor supply conduit 334 to a temperature of about 40 degrees Celsius, about 60 degrees Celsius, about 80 degrees Celsius, or any temperature in between these values, or even more if needed or desired. Higher temperatures may result in less condensation of water vapor onto the surfaces of the water vapor supply conduit 334, but the temperature may be constrained by, for example, compatibility with operating temperatures of components between the flow restrictor 332 and the reaction chamber 102.

A temperature controller 348 may be used to control the first water vapor source heater jacket 314, the second water vapor source heater jacket 318, the third water vapor source heater jacket 324, the water vapor supply heater jacket 340, and the vent conduit heater jacket 346. In some embodiments, the temperature controller 348 may be part of the control unit 108 (shown in FIG. 1). In some embodiments, the water vapor supply conduit 334 and vent conduit 342 may be at the same temperature or at different temperatures. In some embodiments, the vent conduit heater jacket 346 and the water vapor supply heater jacket 340 may be independently controlled, while in other embodiments, they may not be independently controlled. For example, the water vapor supply heater jacket 340 and vent conduit heater jacket 346 may be set to the same temperature, or a temperature offset between them (for example, about 10 degrees Celsius or more, about 20 degrees Celsius or more, or about 30 degrees Celsius or more) may be defined. Similarly, in some embodiments, the first water vapor source heater jacket 314, the second water vapor source heater jacket 318, and the third water vapor source heater jacket 324 may be independently controlled or may be controlled as a set, either at the same temperature or with defined offsets between the heaters. Temperature offsets may be chosen so that water vapor tends to condense farther away from the reaction chamber (e.g., reaction chamber 102 (shown in FIG. 1)) in order to reduce the likelihood that condensed water will be exposed to AHF.

To achieve consistent substrate precleaning, flow of the water vapor 18 into the reaction chamber 102 (shown in FIG. 1) may advantageously be well-controlled. Thus, it may be desirable to limit or substantially eliminate condensation of the water vapor 18 during transit to the reaction chamber 102. Advantageously, the first water vapor source heater jacket 314, second water vapor source heater jacket 318, third water vapor source heater jacket 324, water vapor supply heater jacket 340, and vent conduit heater jacket 346 may be form-fitted to the components enclosed within them in order to guard against cold spots where water vapor may condense and to mitigate any fluctuations in the ambient temperature, which may vary considerably throughout the day and may be influenced by the outside temperature, HVAC systems, nearby equipment, and so forth. Further, cooperation of the first water vapor source heater jacket 314, second water vapor source heater jacket 318, and third water vapor source heater jacket 324 allows partial pressure of the water vapor 18 within the water vapor delivery system 106 to be constant. Mass flow rate of the water vapor 18 may therefore be controlled using the PFC 308, and not an MFC device, simplifying arrangement and operation of the water vapor delivery system 106.

Passivation

While AHF and water vapor may be used as effective reactants for precleaning substrates, it is desirable to limit corrosion, etching, and so forth that may occur on components such as mass flow controllers, regulators, gas lines, filters, valves, and so forth that may occur when AHF and water vapor come into contact with component surfaces in the flow path of the AHF and water vapor. Even if the water content of an AHF source (e.g., an AHF gas bottle) is reduced by the use of a purifier, some water may still be present and may eventually lead to corrosion of components.

As discussed above, it may be possible to reduce corrosion by, for example, replacing stainless steel with Hastelloy components. However, not all components may be replaceable with components made from different materials that are less susceptible to corrosion, and even some less-reactive materials may still corrode over time.

In some embodiments, a reactive fluorine source may be used to form a passivation layer on the surface of one or more components. Preferably, AHF is used to form a passivation layer in situ without the use of other reactants and without requiring high temperatures. For example, components may be exposed to AHF (e.g., less than 1 wppm of AHF) to allow for the formation of a passivation layer including $CrF_x$, $FeF_x$ and NiF into a depth of interior surfaces sufficient to resist exposure to $HF_x$, and this process may occur at a temperature of about 100 degrees Celsius or less, preferably about 70 degrees Celsius to 100 degrees Celsius. Formation of the passivation layer while mitigating corrosion that may lead to particle shedding preferably uses an anhydrous hydrogen fluoride source with very low moisture content, for example about 500 parts per billion or less of water. For example, the anhydrous hydrogen fluoride delivery system 104 may be used to provide anhydrous hydrogen fluoride with sufficiently low moisture content. If the moisture content of the AHF is not low enough, components may corrode rather than forming a passivating layer.

Figure 4:
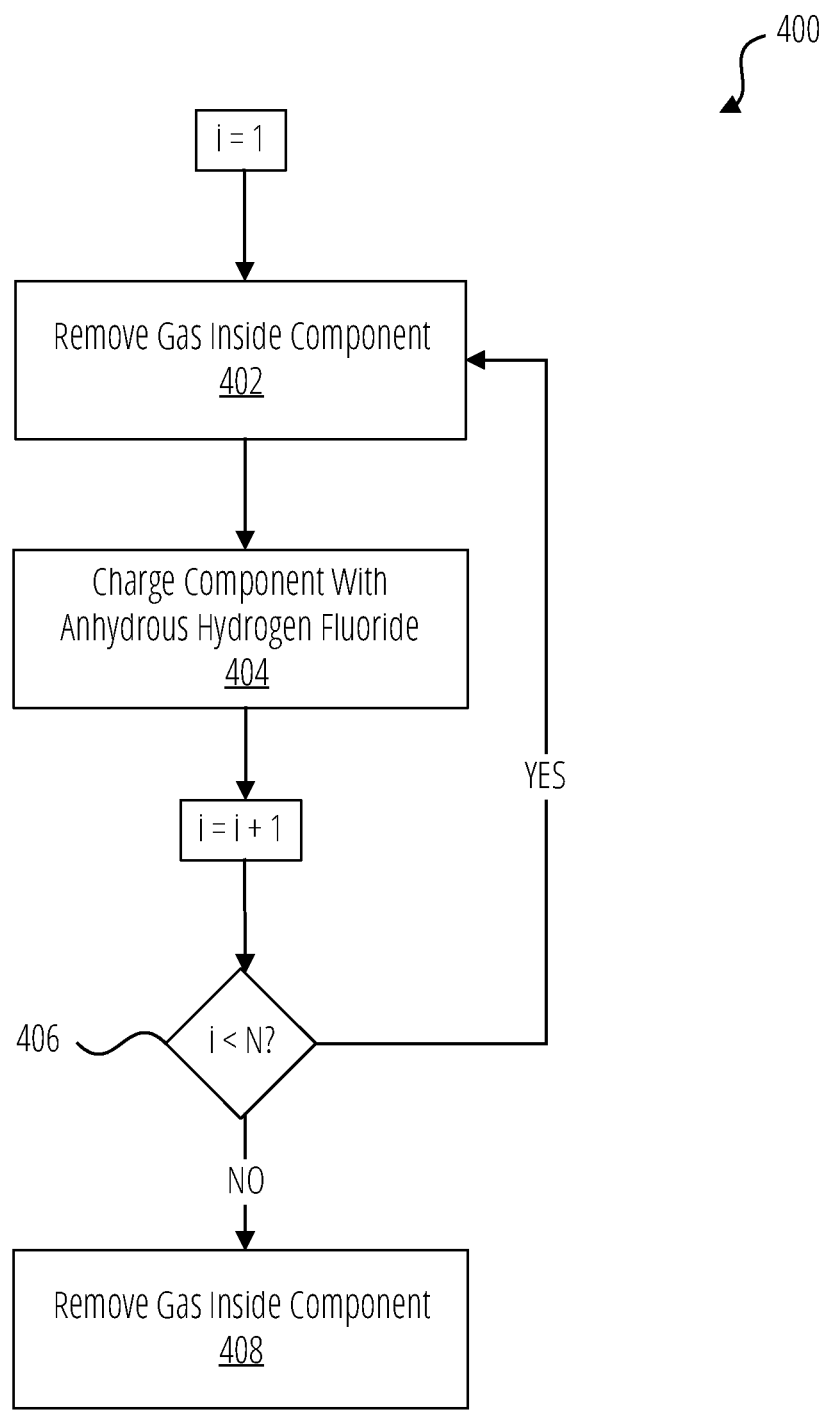
FIG. 4 schematically depicts a gas delivery component passivation process according to some embodiments.

FIG. 4 schematically depicts a passivation process 400 according to some embodiments. At block 402, gas inside a component may be removed, for example by evacuation using a vacuum pump. At block 404, the component may then be filled with anhydrous hydrogen fluoride. The flow of anhydrous hydrogen fluoride may be stopped and the hydrogen fluoride may be maintained within the component in fluid isolation (for example, by closing one or more valves to confine the AHF within the component) for a period of time such as, for example, about 5 minutes to about 60 minutes, preferably about 20 minutes to about 45 minutes, including about 30 minutes. A passivation layer may build up on the interior surfaces of the component as HF formed by the AHF and moisture present in the AHF reacts with the interior surfaces of the component.

Blocks 402 and 404 may be repeated multiple times, for example about 40 times, about 50 times, about 60 times, or any number between these numbers, or even more times if needed. In some cases, an inert gas such as, for example, argon or nitrogen, may be used before each cycle, after each cycle, or both to flush the component, in order to remove remaining AHF, water vapor, condensed water, and so forth from the component. Flushing the component may be performed for a period of time such as, for example, about 5 minutes to about 60 minutes, preferably about 20 minutes to about 45 minutes, including about 30 minutes. F At decision point 406, if the removal and charging blocks 402 and 404 have been repeated the desired (N) number of times, the gas may be removed, for example by a vacuum pump, at block 408, thereby completing the passivation process.

In some embodiments, the passivating film may be a first passivating film and the method may further comprise generating a fluorine radical species using a remote plasma unit, communicating or flowing the fluorine radical species to a reducing conduit connected to the gas delivery component, and forming a second passivating film within the reducing conduit using the fluorine radical species. It will be appreciated that passivating interior surfaces of the one or more of the reducing conduit 120 (shown in FIG. 1), the transfer tube 118 (shown in FIG. 1), and the reaction chamber 102 (shown in FIG. 1) may limit (or prevent) corrosion therein in the event that entrained moisture and AHF reaches interior surfaces of the structures.

Substrate Precleaning Methods

Figure 5:
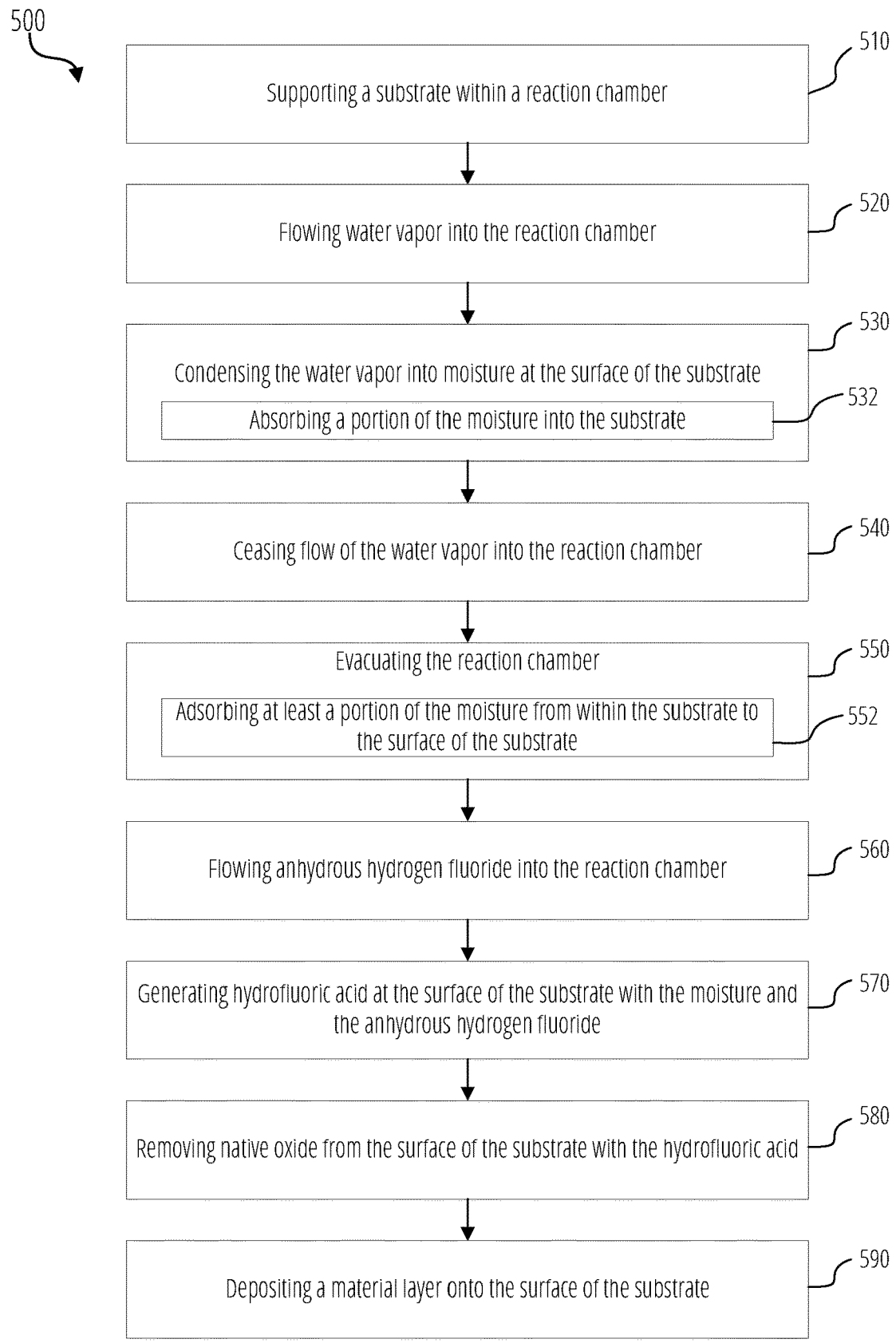
FIG. 5 schematically depicts a method of precleaning a substrate according to some embodiments.

FIG. 5 schematically depicts a substrate precleaning process 500 wherein water vapor and AHF are sequentially introduced into a reaction chamber to generate HF acid in situ to remove native oxide from a substrate according to some embodiments.

At block 510 a substrate is supported in a reaction chamber, e.g., the substrate 10 (shown in FIG. 1) supported in the reaction chamber 102 (shown in FIG. 1). A block 520 water vapor, e.g., the water vapor 18 (shown in FIG. 1), is flowed in the reaction chamber. In certain embodiments, the water vapor may be flowed into the reaction chamber without AHF, the water vapor consisting of or consisting essentially of water vapor in such embodiments (i.e., without entrained moisture). In accordance with certain examples, the reaction chamber and/or the water vapor handling components may have been purged, such as using a carrier gas.

At block 530 a least a portion of the water vapor is condensed into moisture at the surface of the substrate, for example, using the susceptor cooling circuit 138 (shown in FIG. 1) to heat the substrate to a temperature cooler than that of the water vapor provided to the reaction chamber. At block 532 a portion of the moisture condensed onto the surface of the substrate is absorbed into the bulk material forming the substrate and/or a native oxide layer overlaying the substrate, e.g., the native oxide layer 12 (shown in FIG. 1). At block 540, flow of the water vapor to the reaction chamber ceases. At block 550 and block 552, the reaction chamber is evacuated and water vapor removed from within the interior of the reaction chamber, and absorbed moisture adsorbed from the substrate such that moisture is resident on the surface of the substrate and/or the native oxide overlaying the surface of the substrate.

At block 560 anhydrous hydrogen fluoride is flowed into the reaction chamber, for example, the AHF 16 (shown in FIG. 1) from the AHF delivery system 104 (shown in FIG. 1). In certain embodiments the AHF may consist of or consist essentially of AHF. At block 570, hydrofluoric (HF) acid is generated at the surface of the substrate and/or native oxide overlaying the surface of the substrate using the adsorbed moisture and the AHF provided by the AHF delivery system, and, at block 580, at least a portion of the native oxide is removed from the substrate using the HF acid generated using the adsorbed moisture and the AHF provided by the AHF delivery system. At block 590, a material layer may be deposited onto the substrate, for example, by removing the substrate from the reaction chamber and thereafter seating the substrate in a process module, such as a process module configured to deposit material layers onto substrates using chemical vapor deposition (e.g., epitaxial) or atomic layer deposition techniques. It will be appreciated that generating the HF acid in situ (at the surface of the substrate and/or the native oxide overlaying the substrate surface), by sequential introduction of water vapor and AHF, limits (or prevents) corrosion of components within the semiconductor processing system.

Figure 6:
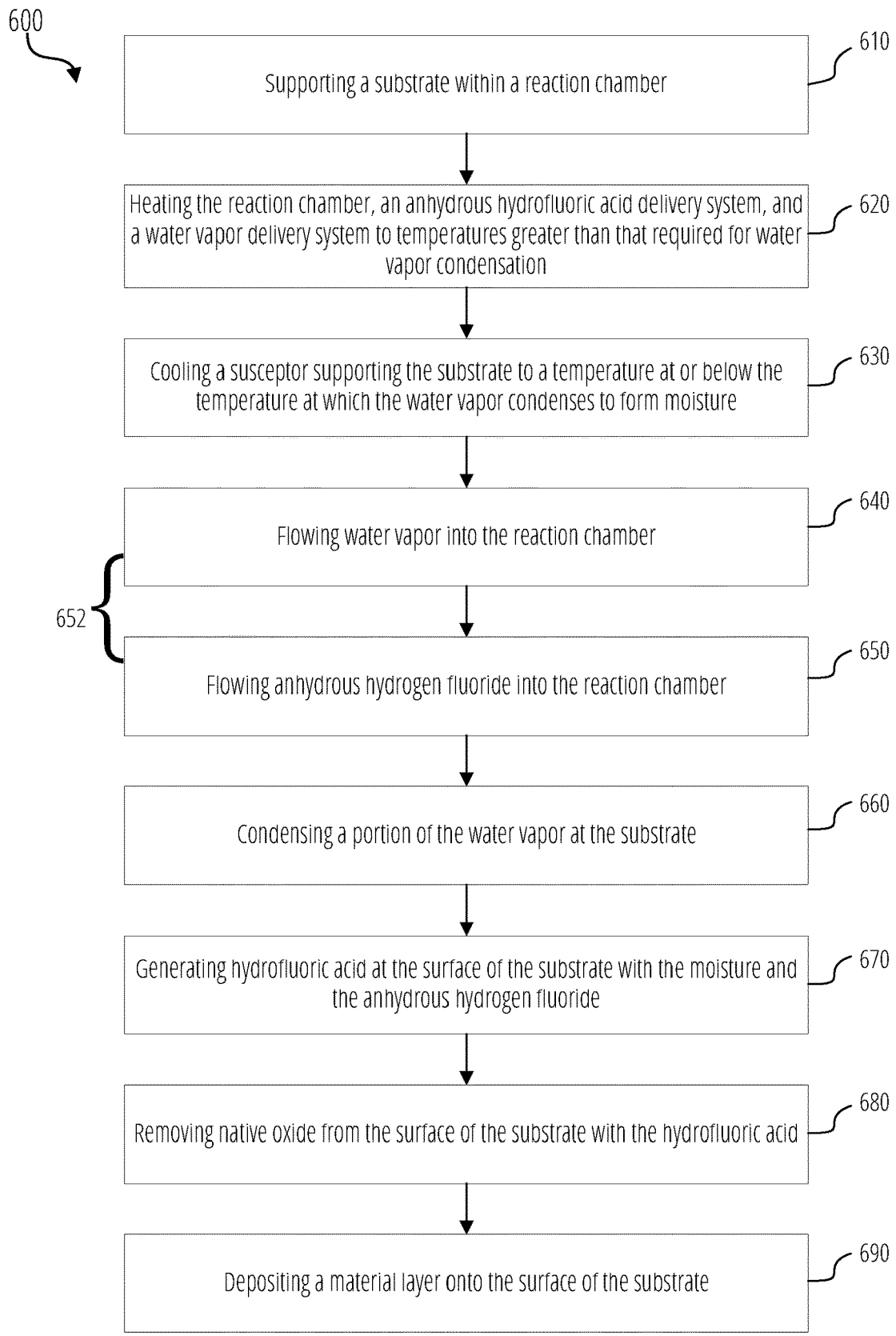
FIG. 6 schematically depicts another method of precleaning a substrate according to some embodiments of the present disclosure.

FIG. 6 schematically depicts a substrate precleaning process 600 wherein water vapor and AHF are simultaneously (e.g., co-flowed) with one another to generate HF acid in situ to remove native oxide from a substrate according to some embodiments of the present disclosure.

At block 610, a substrate is supported within a reaction chamber, e.g., the substrate 10 (shown in FIG. 1) supported within the reaction chamber 102 (shown in FIG. 1). At block 620, the reaction chamber, an AHF delivery system, and a water vapor delivery system connected to the reaction chamber are heated to one or more temperatures that are greater than that required for water vapor condensation. In certain examples, the AHF delivery system may be heated such that a temperature gradient exists between the AHF delivery system and the reaction chamber. For example, one or more components of the AHF delivery system may be heated to a temperature that is lower than that of the reaction chamber. In accordance with certain examples, the water vapor delivery system may be heated such that a temperature gradient exists between the water vapor delivery system and the reaction chamber. For example, one or more components of the water vapor delivery system may be heated to a temperature that is lower than the temperature to which the reaction chamber is heated.

At block 630, a susceptor supporting the substrate, e.g., the susceptor 116 (shown in FIG. 1) is cooled to a temperature that is at or below the temperature at which the water vapor provided by the water vapor delivery system condenses to form moisture. At blocks 640 and 650, water vapor and AHF are flowed into the reaction chamber from the water vapor delivery system and the AHF delivery system, respectively. As shown with bracket 652, the water vapor and the AHF may be co-flowed with one another into the reaction chamber. In this respect the AHF and the water vapor may be introduced into a reducing conduit, e.g., the reducing conduit 120 (shown in FIG. 1), wherein the water vapor and the AHF are intermixed for common communication to the substrate through a transfer tube, e.g., the transfer tube 118 (shown in FIG. 1) prior to introduction into an interior of a chamber body, e.g., the chamber body 110 (shown in FIG. 1) of the reaction chamber. In certain embodiments, the AHF introduced into the reducing conduit may consist of or consist essentially of AHF and in this respect may include substantially no entrained liquid water or moisture. In accordance with certain embodiments, the water vapor introduced into the reducing conduit may consist of or consist essentially of water vapor, and in further respect may also include substantially no entrained liquid water or moisture. It is also contemplated that the intermixed AHF and water vapor communicated into the chamber body consist of or consist essentially of AHF and water vapor, the mixture including substantially no entrained liquid water or moisture.

At block 660, a portion of the water vapor flowed with the AHF into the chamber body is condensed on a surface of the substrate. At block 670, hydrofluoric acid is generated in situ at the surface of the substrate and/or on a native oxide layer overlaying the surface of the substrate using the water vapor and the AHF co-flowed through the reaction chamber and into the chamber body. At block 680, at least a portion of the native oxide is removed from the surface of the substrate using the hydrofluoric acid generated at the substrate. At block 690, a material layer may be deposited onto the substrate, for example, by removing the substrate from the reaction chamber and thereafter seating the substrate in a process module, such as a process module configured to deposit material layers onto substrates using chemical vapor deposition (e.g., epitaxial) or atomic layer deposition techniques. It will be appreciated that, as in embodiments where AHF and water vapor are sequentially introduced into the reaction, generating the HF acid in situ (at the surface of the substrate and/or the native oxide overlaying the substrate surface) by co-flowing water vapor and AHF into the chamber body of the reaction chamber limits (or prevents) corrosion of components within the semiconductor processing system.

Additional Embodiments

In the foregoing specification, methods and apparatuses have been described with reference to specific embodiments thereof. It will, however, be evident that various modifications and changes may be made thereto without departing from the broader spirit and scope of the embodiments disclosed herein.

Indeed, although the methods and apparatus have been disclosed in the context of certain embodiments and examples, it will be understood by those skilled in the art that the various embodiments of the methods and apparatuses extend beyond the specifically disclosed embodiments to other alternative embodiments and/or uses of the methods and apparatuses and obvious modifications and equivalents thereof. It should be understood that various features and aspects of the disclosed embodiments may be combined with, or substituted for, one another in order to form varying modes of the embodiments of the disclosed systems and methods.

Certain features that are described in this specification in the context of separate embodiments also may be implemented in combination in a single embodiment. Conversely, various features that are described in the context of a single embodiment also may be implemented in multiple embodiments separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

It will also be appreciated that conditional language used herein, such as, among others, "can," "could," "might,"

"may," "for example," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. In addition, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one or more example methods in the form of a flowchart. However, other operations that are not depicted may be incorporated in the example methods and methods that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

The methods disclosed herein may include certain actions taken by a practitioner; however, the methods may also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (for example, as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (for example, as much as reasonably possible under the circumstances). For example, "substantially constant" includes "constant." Unless stated otherwise, all measurements are at standard conditions including temperature and pressure.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present. The headings provided herein, if any, are for convenience only and do not necessarily affect the scope or meaning of the devices and methods disclosed herein.

Accordingly, the claims are not intended to be limited to the embodiments shown herein but are to be accorded the widest scope consistent with this disclosure, the principles and the novel features disclosed herein.

What is claimed is:

1. A semiconductor processing system for precleaning a substrate, the system comprising:
    a reaction chamber;
    an anhydrous hydrogen fluoride delivery system comprising:
        an upstream portion configured to be in fluid communication with an anhydrous hydrogen fluoride source, the upstream portion comprising:
            a pressure gauge configured to be in fluid communication with the anhydrous hydrogen fluoride source;
            a purifier in fluid communication with the pressure gauge and configured to remove water from anhydrous hydrogen fluoride from the anhydrous hydrogen fluoride source;
            a first anhydrous hydrogen fluoride conduit for forming a first portion of a flow path between the anhydrous hydrogen fluoride source and the reaction chamber;
            a mass flow controller configured to be in fluid communication with the first anhydrous hydrogen fluoride conduit and the first portion of the flow path; and
            one or more upstream heater jackets thermally coupled to the pressure gauge, the purifier, the first anhydrous hydrogen fluoride conduit, and the mass flow controller;
        a downstream portion downstream from and in fluid communication with the upstream portion, the downstream portion comprising:
            a second anhydrous hydrogen fluoride conduit for forming a second portion of the flow path between the anhydrous hydrogen fluoride source and the reaction chamber, the second anhydrous hydrogen fluoride conduit being connected to the mass flow controller and configured to fluidly connect, via the mass flow controller, the upstream portion with the reaction chamber; and
            one or more downstream heater jackets thermally coupled to the second anhydrous hydrogen fluoride conduit;
        a water vapor delivery system comprising:
            a water vapor source in fluid communication with a carrier gas source and configured to supply water vapor;

a water vapor supply conduit disposed downstream of the water vapor source and forming a portion of a flow path between the water vapor source and the reaction chamber;

a carrier gas conduit disposed upstream of the water vapor source and configured to be in fluid communication with the carrier gas source and the water vapor source;

one or more water vapor source heater jackets thermally coupled to the water vapor source;

one or more water vapor supply heater jackets disposed downstream of the one or more water vapor source heater jackets and thermally coupled to the water vapor supply conduit; and a pressure flow controller disposed upstream of the water vapor source and the one or more water vapor source heater jackets and configured to be in fluid communication with the carrier gas source and the water vapor source, the pressure flow controller configured to regulate a pressure of carrier gas from the carrier gas source flowing to the water vapor source via the carrier gas conduit; and a reducing conduit in fluid communication with the anhydrous hydrogen fluoride delivery system and the water vapor delivery system, wherein the reaction chamber is in fluid communication with the reducing conduit.

2. The system of claim 1, further comprising a remote plasma unit connected to the reducing conduit, and in fluid communication therethrough with, the anhydrous hydrogen fluoride delivery system, the water vapor delivery system, and the reaction chamber.

3. The system of claim 2, further comprising:
a showerhead disposed inside the reaction chamber and configured to distribute anhydrous hydrogen fluoride and water vapor inside the reaction chamber; and
a susceptor configured to support the substrate within the reaction chamber, wherein the susceptor comprises a susceptor heating element.

4. The system of claim 1, wherein the one or more upstream heater jackets and the one or more downstream heater jackets are form-fitted to the upstream portion and the downstream portion, respectively.

5. The system of claim 1, wherein the anhydrous hydrogen fluoride delivery system further comprises a controller configured to control one or more temperatures of the one or more upstream heater jackets, one or more temperatures of the one or more downstream heater jackets, and a flow rate of anhydrous hydrogen fluoride into the reaction chamber.

6. The system of claim 5, wherein the controller is programmed to maintain the downstream portion at a higher temperature than the upstream portion.

7. The system of claim 5, wherein the anhydrous hydrogen fluoride delivery system further comprises:
a vent portion comprising:
a vent conduit connected to the second anhydrous hydrogen fluoride conduit; and
a vent heater jacket thermally coupled to the vent conduit,
wherein the controller is programmed to maintain the vent conduit at a temperature greater than the temperature of the downstream portion.

8. The system of claim 1, wherein the water vapor delivery system further comprises:
a vent conduit fluidly connected to the water vapor supply conduit;
one or more vent heater jackets thermally coupled to the vent conduit; and
a controller configured to control one or more temperatures of the one or more water vapor source heater jackets and one or more temperatures of the one or more water vapor supply heater jackets,
wherein the controller is further configured to control one or more temperatures of the one or more vent heater jackets.

9. The system of claim 1, wherein the water vapor delivery system further comprises:
a bleed conduit in fluid communication with the carrier gas source and the water vapor source, the bleed conduit configured to reduce backstreaming of one or more of the water vapor or the carrier gas.

10. The system of claim 1, wherein the water vapor source comprises a space for liquid water and an overlying ullage space for water vapor.

11. The system of claim 1, wherein the one or more water vapor supply heater jackets is configured to heat the water vapor supply conduit to a temperature of at least 40 degrees Celsius greater than the temperature of the water vapor source.

* * * * *